United States Patent [19]
Angelucci, Sr.

[11] Patent Number: 5,355,105
[45] Date of Patent: Oct. 11, 1994

[54] MULTI-LAYER FLEXIBLE PRINTED CIRCUIT AND METHOD OF MAKING SAME

[76] Inventor: Thomas L. Angelucci, Sr., 89 Charlan Cir., Cherry Hill, N.J. 08003

[21] Appl. No.: 46,407

[22] Filed: Apr. 12, 1993

[51] Int. Cl.$^5$ .............................................. H01P 3/08
[52] U.S. Cl. .................................... 333/238; 156/182; 156/297; 156/306.6; 257/691; 333/247
[58] Field of Search ........................ 333/238, 246, 247; 29/829–831; 257/664, 666, 668, 691, 728; 174/52.4; 156/47, 182, 297, 306.6, 313

[56] References Cited

U.S. PATENT DOCUMENTS

| | | | |
|---|---|---|---|
| 3,612,744 | 10/1971 | Thomas | 333/238 X |
| 4,916,417 | 4/1990 | Ishikawa et al. | 333/238 X |
| 4,926,007 | 5/1990 | Aufderheide et al. | 156/47 X |
| 5,237,201 | 8/1993 | Tanaki et al. | 257/668 X |

OTHER PUBLICATIONS

High Performance Printed Circuits Made With Low Dielectric Materials, IBM Tech. Discl. Bulletin, vol. 32, No. 3B, Aug. '89, pp. 237, 238.

Primary Examiner—Paul Gensler

[57] ABSTRACT

A novel multi-layer flexible printed circuit for tape automated bonding (TAB) is assembled from three components during the process of TAB bonding the circuit to a semiconductor device for burn in and testing prior to assembly into a system comprising a plurality of tested TAB circuit bonded devices. The first layer comprises a conductive signal plane layer mounted on top of a flexible dielectric layer. The second layer comprises a dielectric spacer layer mounted on top of the conductive signal plane layer. The third layer comprises a conductive ground plane layer mounted on the bottom of a dielectric layer. The conductive ground plane layer is mounted on top of the dielectric spacer layer. Before testing, the inner leads of the composite multi-layer circuit are bonded to the electrode pads of a semiconductor device to be tested. After testing the outer portions of the TAB circuit are cut away leaving the outer leads exposed. The semiconductor device is then connected to its carrier circuit by bonding the outer leads of the tested TAB circuit to the leads of a carrier circuit or package.

15 Claims, 5 Drawing Sheets

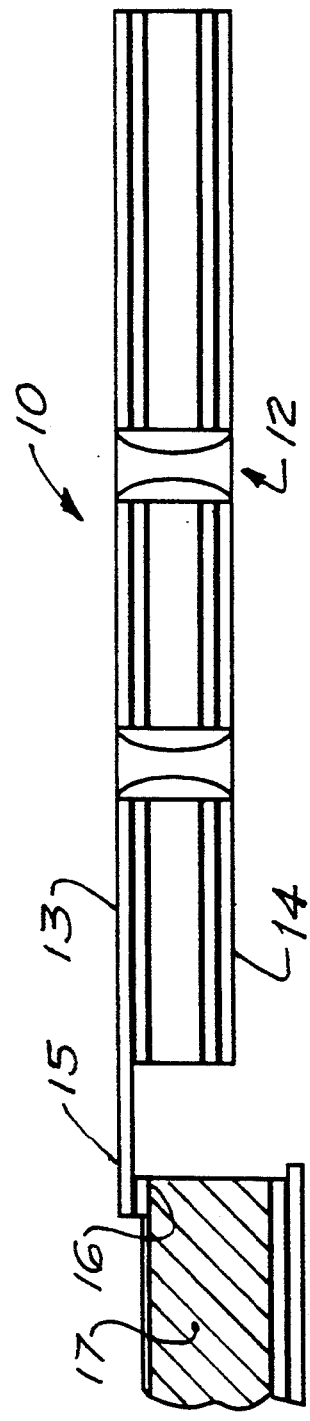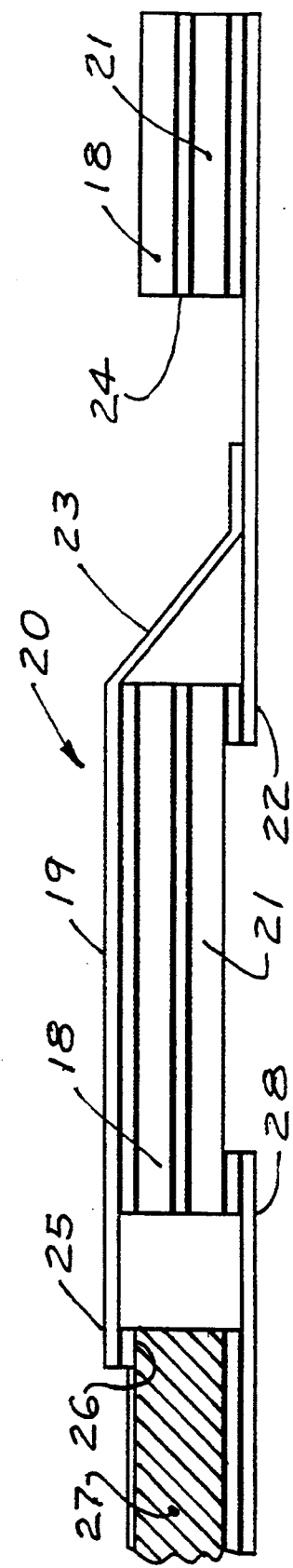
FIGURE 1 (PRIOR ART)
FIGURE 2 (PRIOR ART)

MULTI-LAYER FLEXIBLE PRINTED CIRCUIT AND METHOD OF MAKING SAME

BACKGROUND OF THE INVENTION

1. Field of the Invention

The present invention relates to a novel multi-layer flexible printed circuit of the type employed with tape automated bonding (TAB). More particularly, the present invention flexible printed circuit is adapted to be assembled during TAB inner lead bonding of the inner leads on a signal plane layer and a ground plane layer to a semiconductor device to permit dynamic testing and burn-in of the semiconductor device before acceptance for use in a system.

2. Description of the Prior Art

The present invention is particularly useful in interconnecting high density semiconductor devices known as very large scale integration (VLSI) devices with the leads on a carrier or a lead frame. Such devices now employ in excess of 200 electrode pads on a single device. The size of the state-of-the-art electrode pads on such devices is now approximately 2 mils on 4 mil pitch centers. The tolerance for bonding an inner lead to a pad is already so small as to exclude conventional wire ball bonding techniques while the present invention leads are capable of being bonded to pads which are only 25 microns (1 mil) in size and are located on 50 micron center spacings.

In addition to the improvement which results in increased density of the leads, the present invention incorporates a novel use of strip line technology which provides a means for controlling the characteristic impedance ($Z_0$) of the TAB leads at higher frequencies than could be obtained using isolated fine gold wires for interconnections of the type that are made with conventional wire bonders. Heretofore, multi-layer flexible printed circuit tapes were known. A typical prior art flexible circuit tape is shown and described in my U.S. Pat. No. 4,064,552 which features a novel means for interconnecting two metal conductive layers located in spaced apart horizontal planes by provision of conductive interconnecting fingers which extend through apertures in the two dielectric tape layers which separate the conductive signal layers.

Prior to the novel conductive interconnecting fingers shown and described in our U.S. Pat. No. 4,064,552, it was known to provide conductive vias in the dielectric layer which separated two conductive patterns. This latter technique has been used by computer manufacturers to make mother boards having in excess of 30 layers including plural signal plane layers and plural ground plane layers therein.

It would be desirable to provide a multi-layer flexible printed circuit which could be accurately connected to high electrode pad count high density VLSI devices of the type known as logic chips and memory chips. A typical logic chip is a microprocessor which now requires a large number of input/output electrode pads. In order to accommodate such large number of electrode pads at the perimeter of a high density chip, it is necessary to shrink the size and pitch of the pads. The requirement for high density pads has now made it extremely difficult to test such high density devices while in wafer form with conventional probe points of the type employed with test sets

SUMMARY OF THE INVENTION

It is a primary object of the present invention to provide a novel via-less multi-metal layer TAB tape structure for high density semiconductor devices.

It is a primary object of the present invention to provide a novel method of making and assembling a multi-metal layer TAB tape structure for high density semiconductor devices.

It is a primary object of the present invention to provide a novel method and structure for a multi-metal layer TAB tape having a controllable strip line characteristic impedance.

It is another primary object of the present invention to provide a process for properly testing and eliminating all inoperative and marginal semiconductor devices before incorporating them into a system.

It is another object of the present invention to provide a novel metal multi-layer TAB tape structure which enables ease of testing to confirm known good die by pretest and burn-in.

It is another general object of the present invention to provide an isolated ground plane to either eliminate or suppress crosstalk in high frequency circuit structures.

It is another object of the present invention to provide a segmented ground plane for substantially eliminating all crosstalk.

It is another object of the present invention to provide a novel multi-metal layer TAB tape that is well suited to connect a plurality of high density semiconductor devices (chips) to a substrate employing a simple interconnection pattern on a substrate to provide fast access low cost multi chip modules such as a megabyte memory card which replaces a hard disk drive.

According to these and other objects of the present invention, there is provided a conductive metal signal plane layer mounted on a first dielectric tape which is bonded at the signal plane inner leads to the electrode pads on a semiconductor device. An imperforate dielectric spacer layer having a predetermined thickness and dielectric constant is attached on top of the metal signal plane layer leaving the inner and outer leads of the signal plane layer exposed. A conductive metal ground plane layer is mounted on a second dielectric tape and is further provided with inner and outer leads which are to be bonded to selective ones of said pads on said semiconductor device. The ground plane layer is attached to the spacer or separator layer attached on top of the signal plane layer preferably after the inner leads of the ground plane layer are bonded to the pads of the semiconductor device to complete a high density semiconductor device with TAB bonded signal plane leads having a desired characteristic impedance which is controlled substantially by the thickness of the separator layer.

BRIEF DESCRIPTION OF THE DRAWINGS

FIG. 1 is an elevation in section of a prior art two sided printed circuit mounted on a single dielectric tape or printed circuit board;

FIG. 2 is an elevation in section of a prior art multi-layer flexible printed circuit which employs two flexible dielectric layers each having a conductive signal plane layer on the outside of the dielectric layer and which are selectively connected through apertures extending through the dielectric layers;

DESCRIPTION OF THE PREFERRED EMBODIMENT

Figure 3:
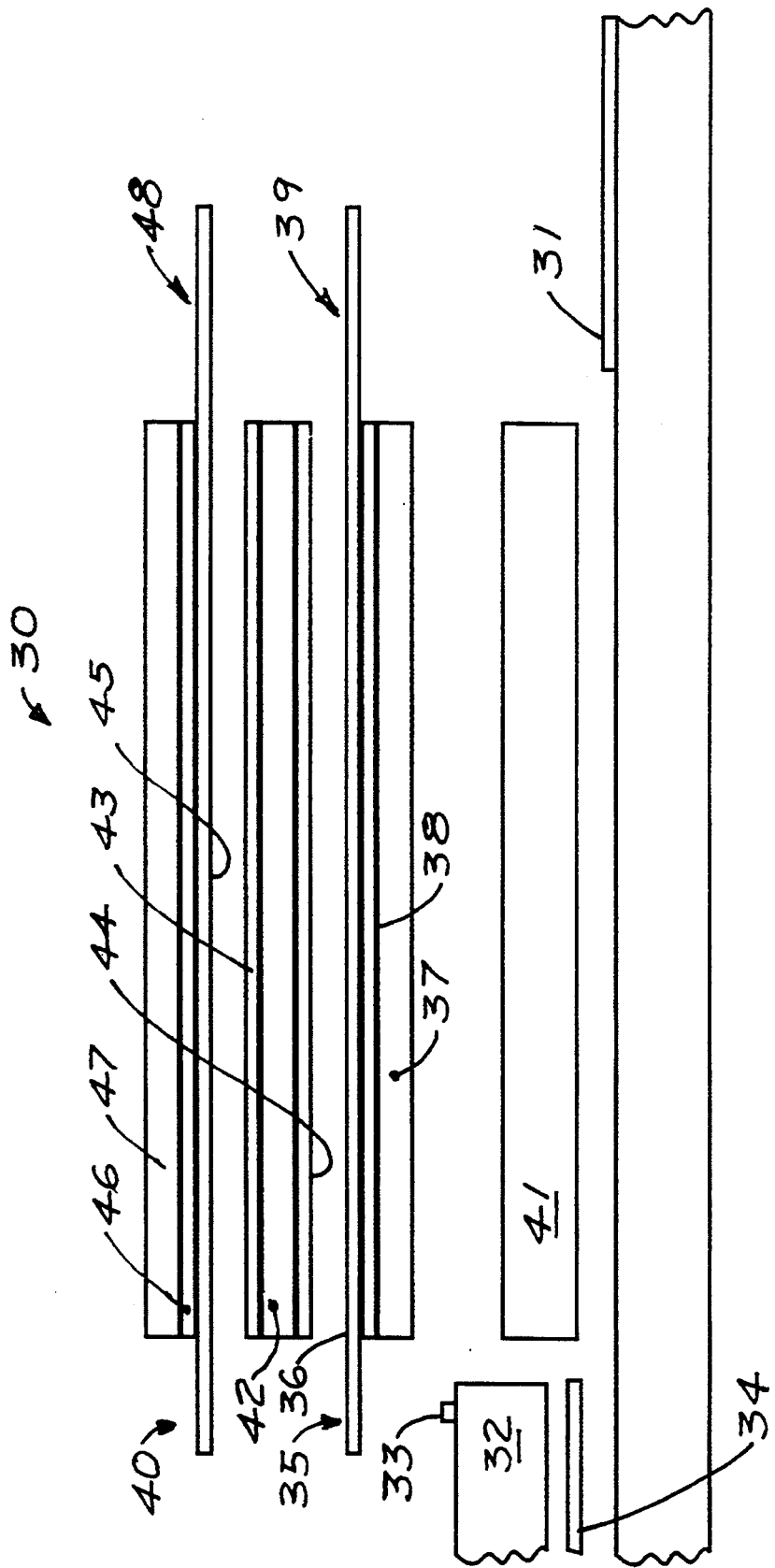
FIG. 3 is a exploded view in elevation of the preferred embodiment of the present invention metal multi-layer flexible printed circuit showing the principal elements prior to assembly.

Refer now to FIG. 1 showing a prior art printed circuit board or tape which comprises a board or tape 11 having vias 12 which are filled with conductive metal, usually by plating to interconnect a first signal plane layer 13 and a ground plane layer 14 bonded to obverse sides of the PC board 11. The inner leads 15 of the signal plane layer are shown connected to the pads 16 of a semiconductor device 17 to form a rigid or flexible chip to package interconnect circuit. The process for producing the composite PC board 10 is known to be relatively expensive and requires that one side of the board must be masked when work is done on the pattern on the other side.

Refer now to FIG. 2 showing a section in elevation of a prior art multi-metal layer printed circuit 20 which employs two flexible dielectric layers each of which has a conductive signal plane or ground layer on the outside. In my U.S. Pat. No. 4,064,552 novel conductive interconnecting fingers are employed through apertures to connect the conductive metal layers. The first dielectric layer 18 is shown having a conductive metal signal plane layer 19 adhesive bonded thereto. A second dielectric layer 21 is shown having a ground plane or signal layer 22 bonded thereto which is interconnected to the signal plane layer 19 by a finger or extension 23 on the signal plane layer 19 which extends through the aperture 24 in both dielectric layers 18 and 21. The inner leads 25 of the signal plane layer 19 are shown connected to the electrode pads 26 of a semiconductor device 27 which is mounted on a ground plane or backside contact 28. Most commercial semiconductor houses are tooled to produce such single metal layer TAB lead patterns on flexible tape. This prior art device has been commercially successful in that manufacturers around the world have tooled up and mass produced one metal layer TAB lead patterns and can now combine two independent metal lead pattern layers by joining and bonding two single TAB lead pattern layers together at the dielectric side opposite the conductive layer to form such a two metal layer composite. Another advantage of the FIG. 2 prior art device is that the manufacturing process does not require that the obverse side of single layer composites be protected during the manufacturing process of the conductive layer.

Refer now to FIG. 3 showing an exploded view in elevation of the present invention multi-metal layer flexible printed circuit 30. The package 29 may be a substrate or a lead frame or a ceramic pin grid carrier or other forms of support devices such as a liquid crystal panel display. A lead out circuit such as a lead frame 31 is shown mounted on the package 29 for interconnection to the chip 32 which is provided with a plurality of pads or electrodes 33 that are employed to interconnect the circuit on the chip 32 with the lead out circuit 31. The chip 32 is usually bonded by chip adhesive 34 to the package 29. The layer 34 may be conductive so as to connect to a ground plane for the chip 32. The inner leads 35 of the signal plane layer 36 are shown adhesively bonded to a signal plane lead carrier film 37 by means of an adhesive layer 38 therebetween. The signal plane layer 36 is further provided with an outer lead 39 which may be depressed by a gang bonding tool or single point bonding tool to interconnect individual outer leads 39 to the lead out circuit 31. To relieve strain on the inner leads and outer leads support spacer 41 is provided.

In the preferred embodiment of the present invention, a novel separator spacer layer 42 is provided with an adhesive layer 43 and 44 on opposite sides for connecting the ground plane layer 45 to the signal plane layer 36 with a predetermined and calculated thickness dielectric layer 42 therebetween. It will be understood that the spacer or separator dielectric layer 42 in the preferred embodiment of the present invention can be as small as two to three mils in thickness using a high dielectric polyamide flexible layer. This composite layer results in a strip line characteristic impedance for the signal plane lines on layer 36 of approximately 50 ohms. It is an important feature providing a perfect matched impedance of approximately 50 ohms for many semiconductor devices which are manufactured to this impedance standard. The metal conductive ground plane layer 45 is attached by an adhesive layer 46 to the inner side of a ground plane lead carrier film 47.

Figure 4:
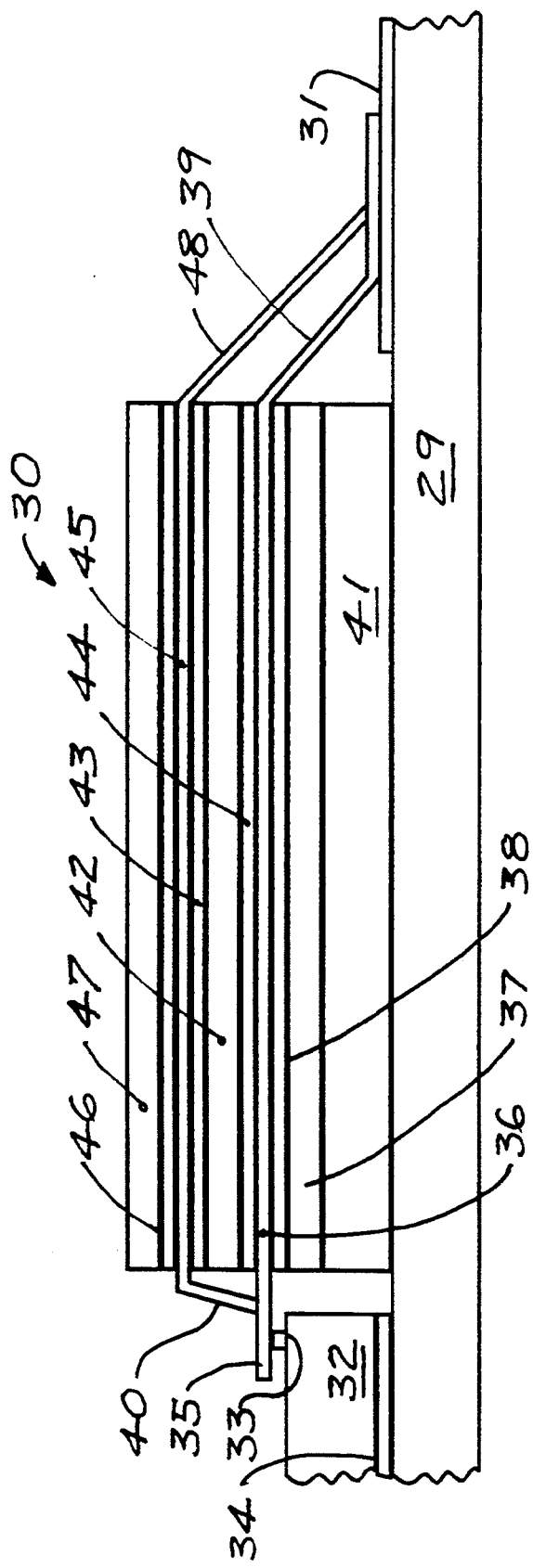
FIG. 4 is an elevation view showing the multi-metal layered flexible printed circuit of FIG. 3 after the elements are assembled and connected between a semiconductor device and the lead frame of a carrier on a substrate.

Refer now to FIG. 4 showing the elements of the multi-metal layer printed circuit 30 of FIG. 3 assembled onto the circuit board or substrate package 29. The numerals used to describe the individual elements and composite elements of FIG. 3 are also identical to those employed in FIG. 4 and do not require additional explanation. The purpose of FIG. 4 is to more clearly describe the method of assembling the novel multi-metal layer printed circuit prior to testing. After the chip 32 is attached to the package 29, the element comprising the signal plane layer and its supportive lead carrier film 37 are first bonded to the pads 33 of the chip 32 at the inner leads 35. The outer leads 39 are subsequently bonded after testing to the lead out circuit 31. This is accomplished by mounting the package 29 on an XY table and moving the XY table while holding the signal plane layer 36 fixed until the inner leads 35 register perfectly over the pads 33 as will be explained hereinafter. The outer leads 39 and 48 are not at the present time bonded to the package 29. After the signal plane 36 is attached to the pads 33 of the chip 32, the second composite layer comprising the separator spacer 42 is first prealigned over the signal plane layer 36 employing registration apertures or sprocket holes (not shown). The separator is then attached to the signal plane layer 36 employing heat and/or pressure as is well known with adhesives.

After the separator layer 42 is in place, the ground plane layer 45 with its inner leads 40 are registered over the electrode pads 33. In the preferred embodiment of the present invention, the inner leads 40 are first connected to electrode pads 33 before the ground plane 45 is connected to the adhesive layer 43 of the separator layer 42. Alternatively, the ground plane composite layer 45–47 may be attached to the separator layer 42 to 44 before bonding the inner leads 40 to the electrode pads 33.

Having explained a preferred process of assembling the signal plane layer and ground plane layer to the electrode pads 33 of the chip 32 employing a separator layer 42-44 therebetween, it will be appreciated that the two conductive layers 36 and 45 are separated by a thickness represented by the dielectric layer 42-44 and this thickness is directly proportional to the characteristic impedance of the strip line 45, 36. In the preferred embodiment of the present invention, the desired characteristic impedance of the strip line is obtained by empirical test to assure that the multi-metal layer inner connecting TAB circuit has the desired characteristic impedance for each of the inner connecting signal lines. It will now be appreciated that the ground plane 45 is provided with a plurality of inner leads 40 and outer leads 48 which, after testing, will connect the lead frame circuit 31 to ground connection electrodes 33 on the chip 32. If it is desired to completely eliminate crosstalk caused by the ground plane 45 forming a return of current path, it is possible to segment the ground plane 45, thus further eliminating crosstalk.

FIGS. 3 and 4 illustrate a multi-metal layer printed circuit 30 which has been tested and excised from the parts of the carrier film 37, 47 used for testing. Had the chip 32 not passed the test phase, it would not have been connected to the substrate 29 at chip adhesive layer 34 or have had the outer leads 39, 48 of circuit 30 connected to the circuit 31.

The characteristic impedance $Z_0$ of the strip lines of the circuit 30 connecting the chip 32 to the carrier circuit 31 is equal to L/CR where R is the ohmic resistance and L and C are the inductance and the capacitance respectively.

As an example, in the preferred embodiment shown, the strip line inductance $L = 5l \; [\ln 6h.t + 0.8w]\mu K$ where l is the length, h is the distance from the ground plane 45 to the center of the conductive circuit lead 36, t is the thickness of the copper circuit lead 36 and w is the width of the lead 36. The skin factor K for copper at a frequency of 2 gigahertz is 0.0039 and the magnetic permeability $\mu$ of copper is unity. Thus, for a lead 36 having $l = \frac{1}{2}$ inch, $h = 15/1000$ inch, $t = 10/10,000$ inch, and $w = 30/1,000$ inch, L equals 2.43 nanohenries.

The L value is doubled because of opposing current flow in the ground plane. When the capacitance C is 100 picofarads, $Z_0 = 4.87 \times 10^{-9}/97.4 \times 10^{-12} = 48.7$ ohms assuming R is unity. The value of $Z_0$ is preferably fine tuned using actual empirical test values at the preferred frequency of operation.

Figure 5:
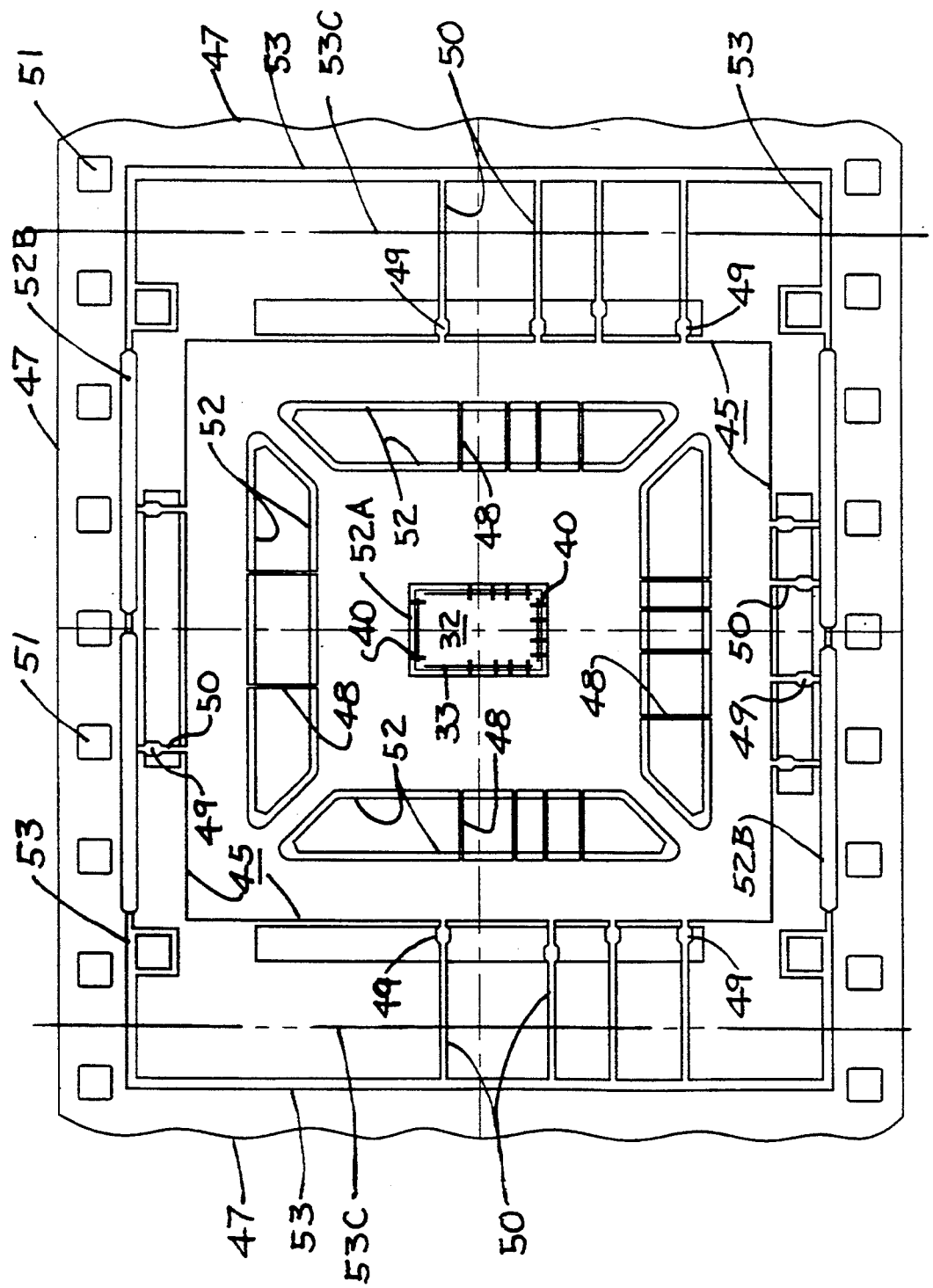
FIG. 5 is a plan view of a preferred embodiment ground plane layer attached to a flexible dielectric supporting layer before being reversed for assembly.

Refer now to FIG. 5 showing a plan view of a preferred ground plane layer 45 made from copper film that has been photoresist masked and etched to provide a pattern which comprises the large ground plane 45 having outer leads 48 which extend across the apertures 52 in the polyamide lead carrier film 47. The inner leads 40 extend into the aperture 52A which surrounds the chip 32. The chip 32 with pads 33 is superimposed on FIG. 5 to show its relative position and is not actually positioned below the conductive ground plane 45 in this view. The conductive ground plane 45 is provided with test pads 49 on test pad leads 50 which were connected during manufacture to the bus structure 53, but are shown severed therefrom by punched apertures 52B. The singulation cut lines 53C are used to sever the printed circuit lead patterns 45-47 from the continuous tape 47. There is further provided in the composition ground plane structure a plurality of sprocket holes or apertures 51 which permit accurately mechanically positioning the ground plane layer 47 over the separator layer 42 and the signal plane layer 36. It is possible to produce oversize alignment apertures 51 which enable further precise alignment after gross alignment.

Figure 6:
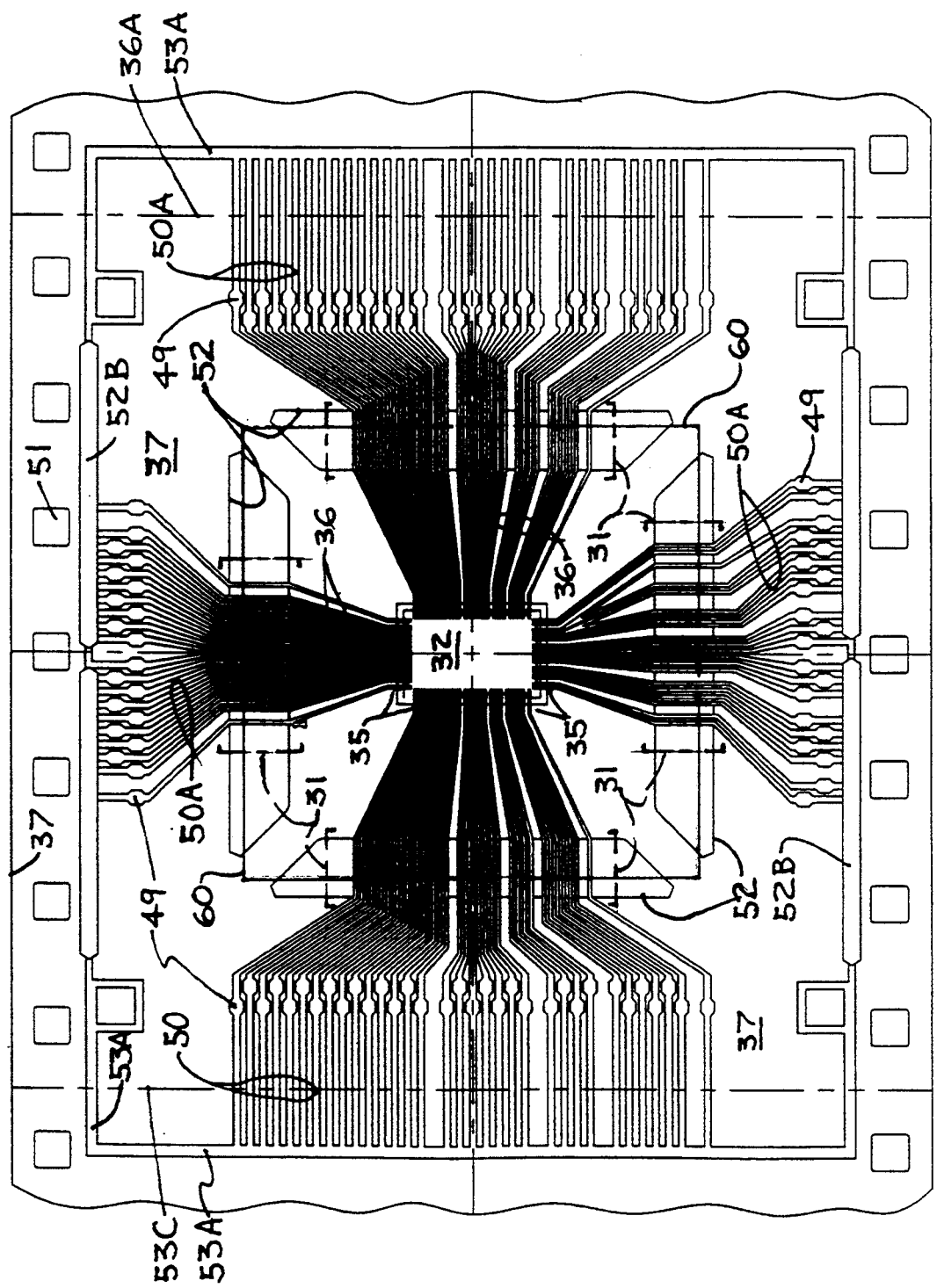
FIG. 6 is a plan view of a signal plane layer attached to a flexible dielectric supporting layer before being attached to a semiconductor device for testing and burn-in after assembly.

Refer now to FIG. 6 showing a plan view of the printed circuit lead pattern 36-38 which includes the signal plane layer 36 attached to a flexible dielectric supporting layer 37 after being positioned over a semiconductor chip 32. The inner leads 35 are shown extending outward into the signal plane as leads 36 which extend over the lead frame circuit 31 (not shown, but occur at the phantom lines). Leads 36 then fan out and are shown as having test pads 49 on the test pad leads 50A which connect to another bus 53A similar to the bus 53 on the ground plane composite layer 45. In the preferred embodiment of the present invention, the inner leads 35 are single point or gang bonded to the pads 33 on the chip 32 after being aligned by moving the chip relatively to the signal plane 35-36. However, after the leads 35 are aligned with the pads 33 on the chip 32, they may be gang bonded or partially gang bonded or single point bonded. After the signal plane layer 36 is connected to the chip 32, the separator layer 42 is added. Then the ground plane layer is added on top of the assembly to form the novel multi-metal layer flexible printed circuit in its assembled state. Prior to testing, the device 32, slots 52B are punched and the pattern 35-38 is severed from tape 37 at singulation cut lines 53C which isolates leads 50A as described with reference to leads 50. After testing individual composite patterns 30 and devices 32, the composite circuit 30 shown in FIG. 4 is cut from the supporting dielectric tape layers 37, 47 at a cut line 60 that runs through the aperture 52 in tapes 37 and 47 which leaves the outer leads 39 and 48 extending horizontally outward as shown in FIG. 3. The composite printed circuit lead pattern now comprises a signal plane layer and a ground plane layer connected to a tested chip 32. If the device 32 passes the test and burns in it may now have its outer leads 39, 48 shown in FIGS. 3 and 4 connected to the circuit 31 on package 29. Had the device 32 not passed in testing, it would not have ever become connected into a multi-chip module system.

A major feature of the present invention is that each chip 32 and its connected strip lines has been tested under actual impedance conditions before ever being permanently attached to a circuit board and integrated thereto having the same characteristic impedance under test and in final assembly.

What is claimed is:

1. The method of making a predetermined characteristic impedance multi-layer flexible printed circuits, comprising the steps of:
    attaching a ground plane conductive layer to a first apertured supportive dielectric lead carrier,
    forming a conductive pattern in said ground plane layer having exposed inner and outer leads extending therefrom,
    attaching a signal plane conductive layer to a second apertured supportive flexible dielectric lead carrier,
    forming a conductive pattern in said signal plane layer to provide a plurality of tape automated bonding (TAB) leads comprising exposed inner and outer leads extending therefrom, forming a dielectric spacer having a predetermined thickness selected to provide a desired strip line characteristic impedance $Z_0$ when employed as a spacer between said leads on said signal plane and said ground plane, attaching said conductive signal plane layer to one side of said dielectric spacer to provide its exposed inner and outer leads extending from the edges of said spacer in a first plane, attaching said conductive ground plane to the other side of said dielectric spacer to provide its exposed inner and outer leads extending from the edges of said spacer in a second plane, whereby said leads of said signal plane layer form individual strip lines having a predetermined desired characteristic impedance $Z_0$.

2. The method as set forth in claim 1 which further includes the step of:

providing the said apertures in said first and second dielectric lead carriers prior to attaching said conductive layers to said dielectric lead carriers.

3. The method as set forth in claim 1 which further includes the steps of:

providing a semiconductor device having electrode pads thereon, aligning said conductive signal plane layer on said second apertured lead carrier over the electrode pads on said semiconductor device, bonding said inner leads of said signal plane layer to the pads on said semiconductor device before the steps of attaching said dielectric spacer and said ground plane layer to said signal plane layer.

4. The method as set forth in claim 3 which further includes the steps of:

performing the step of attaching said dielectric spacer to said signal plane layer by aligning said dielectric spacer over said bonded signal plane layer, and then attaching said spacer to said signal plane layer leaving said electrode pads on said semiconductor device and said inner leads and said outer leads of said signal plane layer exposed.

5. The method as set forth in claim 4 wherein the step of attaching said ground plane layer to the other side of said dielectric spacer further includes the step of aligning said inner leads of said ground plane layer over selected electrode pads on said semiconductor device before attaching said ground plane layer to said spacer.

6. The method as set forth in claim 5 which further includes the step of bonding the inner leads of said ground plane layer to said selected electrode pads on said semiconductor device before permanently attaching said ground plane layer to said spacer.

7. A multi-layer flexible printed circuit comprising:

a conductive signal plane layer defining strip line leads attached to the top of and supported by an apertured first lead carrier dielectric flexible film a conductive ground plane layer attached to the bottom of and supported by a second apertured lead carrier dielectric flexible film, a dielectric spacer layer having a predetermined controlled thickness determined by calculating a desired characteristic impedance for a strip line, and a pair of adhesive layers one on each side of said dielectric spacer layer for attaching said dielectric layer to said conductive signal plane layer and said conductive ground plane layer forming a plurality of strip lines open TAB leads extending outward on said signal layer having a characteristic impedance $Z_0$ which is proportional to the thickness of said dielectric spacer.

8. A multi-layer flexible printed circuit as set forth in claim 7 which further includes exposed inner leads and outer leads on said conductive signal plane layer and said ground plane layer extending beyond the edges of said dielectric spacer layer.

9. A multi-layer flexible printed circuit as set forth in claim 8 which further includes an untested semiconductor device and wherein said inner leads on said conductive layers which extend beyond said edges of said dielectric spacer layer are connected to electrode pads on said semiconductor device before tested.

10. A multi-layer flexible printed circuit as set forth in claim 9 wherein said outer leads on said conductive layers which extend beyond said edges of said dielectric spacer layer are provided with test probe pads for electrically connecting the untested semiconductor device to a dynamic tester capable of testing and burning in individual semiconductor devices before being interconnected into a system.

11. A multi-layer flexible printed circuit as set forth in claim 8 wherein said inner leads and outer leads on said ground plane layer comprise a plurality of return ground paths.

12. A multi-layer flexible printed circuit as set forth in claim 11 wherein said inner and outer lead return ground paths on said ground plane layer are spaced in vertical alignment apart from said conductive leads on said signal plane layer.

13. A multi-layer flexible printed circuit as set forth in claim 7 wherein the characteristic impedance $Z_0$ of the conductive leads on said signal plane layer is determined empirically by changing the thickness of said dielectric spacer layer after establishing an optimum spacing of leads on said signal plane layer.

14. The method of making predetermined characteristic impedance multi-layer flexible printed circuits, comprising the steps of:

attaching a ground plane conductive layer to a first apertured supportive dielectric lead carrier, forming a conductive pattern in said ground plane layer having inner and outer leads extending therefrom, attaching a signal plane conductive layer to a second apertured supportive flexible dielectric lead carrier, forming a conductive pattern in said signal plane layer to provide a plurality of tape automated bonding (TAB) leads comprising inner and outer leads extending therefrom, forming a dielectric spacer having a predetermined thickness selected to provide a desired strip line characteristic impedance $Z_0$ when employed as a spacer between said leads on said signal plane and said ground plane, attaching said conductive signal plane layer to one side of said dielectric spacer to provide its inner and outer leads extending from the edges of said spacer in a first plane, attaching said conductive ground plane to the other side of said dielectric spacer to provide its inner and outer leads extending from the edges of said spacer in a second plane, whereby said leads of said signal plane layer form individual strip lines having a predetermined desired characteristic impedance $Z_0$, providing a semiconductor device having electrode pads thereon, aligning said conductive signal plane layer on said second apertured lead carrier over the electrode pads on said semiconductor device, and bonding said inner leads of said signal plane layer to the pads on said semiconductor device before the steps of attaching said dielectric spacer and said ground plane layer to said signal plane layer.

15. The method as set forth in claim 14 which further includes the steps of:

performing the step of attaching said dielectric spacer to said signal plane layer by aligning said dielectric spacer over said bonded signal plane layer, then attaching said conductive signal plane layer to one side of said dielectric spacer leaving said electrode pads on said semiconductor device and said inner leads and said outer leads of said signal plane layer exposed.

* * * * *